US010861551B2

(12) United States Patent
Minucci et al.

(10) Patent No.: US 10,861,551 B2
(45) Date of Patent: Dec. 8, 2020

(54) MEMORY CELLS CONFIGURED TO GENERATE WEIGHTED INPUTS FOR NEURAL NETWORKS

(71) Applicant: Micron Technology, Inc., Boise, ID (US)

(72) Inventors: Umberto Minucci, Guidonia Montecelio (IT); Tommaso Vali, Sezze (IT); Fernanda Irrera, Rome (IT); Luca De Santis, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 16/235,066

(22) Filed: Dec. 28, 2018

(65) Prior Publication Data
US 2020/0211648 A1 Jul. 2, 2020

(51) Int. Cl.
*G11C 16/04* (2006.01)
*G06N 3/063* (2006.01)
*G06F 3/06* (2006.01)

(52) U.S. Cl.
CPC ........ *G11C 16/0483* (2013.01); *G06F 3/0604* (2013.01); *G06F 3/0659* (2013.01); *G06F 3/0679* (2013.01); *G06N 3/063* (2013.01)

(58) Field of Classification Search
CPC ....... G11C 7/1006; G11C 16/26; G11C 16/08; G11C 16/0483; G06N 3/063; G06N 3/04; G06N 3/0454; G06F 3/063; G06F 3/0604; G06F 3/0659; G06F 3/0679
See application file for complete search history.

(56) References Cited

U.S. PATENT DOCUMENTS

| 5,040,134 | A | 8/1991 | Park |
| 9,105,330 | B1 | 8/2015 | Eldredge |
| 9,430,735 | B1* | 8/2016 | Vali ...................... G11C 7/1006 |
| 2011/0307433 | A1 | 12/2011 | Dlugosch |
| 2011/0307503 | A1 | 12/2011 | Dlugosch |
| 2018/0039882 | A1* | 2/2018 | Ikeda ................ H01L 27/14618 |
| 2018/0211162 | A1 | 7/2018 | Burr et al. |
| 2018/0330236 | A1 | 11/2018 | Hou et al. |

(Continued)

FOREIGN PATENT DOCUMENTS

WO 2018-007783 A1 1/2018

OTHER PUBLICATIONS

Office Action and Extended Search Report from related Italian patent application No. 201900000691, dated Sep. 26, 2019, 11 pages.

(Continued)

*Primary Examiner* — Hashem Farrokh
(74) *Attorney, Agent, or Firm* — Brooks, Cameron & Huebsch, PLLC

(57) ABSTRACT

A method can include applying a first voltage to a first memory cell to activate the first memory cell, applying a second voltage to a second memory cell coupled in series with the first memory cell to activate the second memory cell so that current flows through the first and second memory cells, and generating an output responsive to the current. The first voltage and a threshold voltage of the second memory cell can be such that the current is proportional to a product of the first voltage and the threshold voltage of the second memory cell.

25 Claims, 8 Drawing Sheets

(56) References Cited

U.S. PATENT DOCUMENTS

2019/0164044 A1* 5/2019 Song .................. G11C 16/0408

OTHER PUBLICATIONS

Geoffrey W. Burr, et al, "Experimental Demonstration and Tolerancing of a Large-Scale Neural Network (165 000 synapses) Using Phase-Change Memory as the Synaptic Weight Element", IEEE Transactions on Electron Devices, Nov. 2015, vol. 62, pp. 3498-3507.
International Search Report and Written Opinion from related international application No. PCT/US2019/066740, dated Apr. 21, 2020, 10 pages.

* cited by examiner

US 10,861,551 B2

1

MEMORY CELLS CONFIGURED TO GENERATE WEIGHTED INPUTS FOR NEURAL NETWORKS

TECHNICAL FIELD

The present disclosure relates generally to memories, and more particularly, to memory cells configured to generate weighted inputs for neural networks.

BACKGROUND

Memory systems may be implemented in electronic systems, such as computers, cell phones, hand-held electronic devices, etc. Some memory systems, such as solid state drives (SSDs), embedded Multi-Media Controller (eMMC) devices, Universal Flash Storage (UFS) devices, and the like, may include non-volatile storage memories for storing host (e.g., user) data from a host. Non-volatile storage memories provide persistent data by retaining stored data when not powered and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), three-dimensional cross-point memory (e.g., 3D XPoint), resistive random access memory (RRAM), ferroelectric random access memory (FeRAM), magnetoresistive random access memory (MRAM), and programmable conductive memory, among other types of memory.

Neural networks are networks that can process information by modeling a network of neurons, such as neurons in a human brain, to process information (e.g., stimuli) that has been sensed in a particular environment. Similar to a human brain, neural networks typically include a multiple neuron topology (e.g., that can be referred to as artificial neurons).

DETAILED DESCRIPTION

Various attempts have been made to implement neural networks in memory devices. For example, in some previous implementations of neural networks, memory cells have operated to emulate a number of neural models to facilitate one or more neural network operating characteristics in a memory.

The embodiments disclosed herein improve upon previous approaches, involving memories to facilitate neural network operations, by including weighted inputs to the neuron models to account for the relative influence of the inputs on the neuron. A weight can correspond to a memory in human brain behavior, for example.

In some examples, an embodiment of a method can include applying a first voltage to a first memory cell to activate the first memory cell, applying a second voltage to a second memory cell coupled in series with the first memory cell to activate the second memory cell so that current flows through the first and second memory cells, and generating an output responsive to the current. The first voltage and a threshold voltage of the second memory cell can be such that the current is proportional to a product of the first voltage and the threshold voltage of the second memory cell. The threshold voltage of the second memory cell can be a weight that weights the current. For example, the weighted current can correspond to a weighted input to a neuron model.

Figure 1:
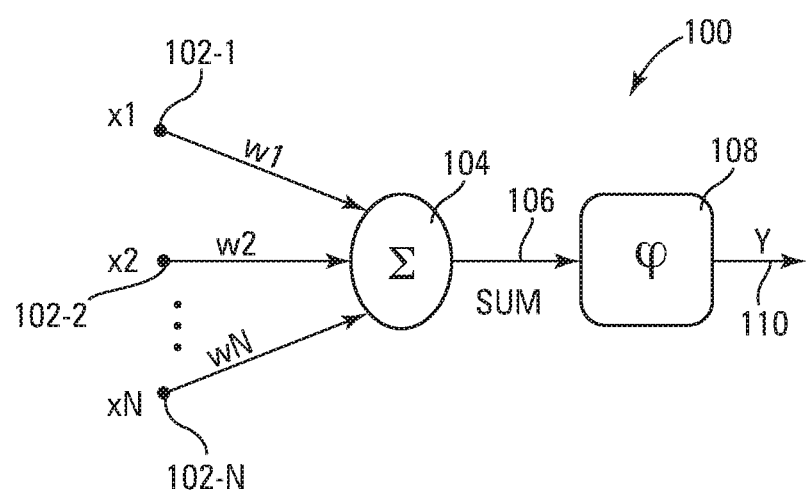
FIG. 1 illustrates an example of an artificial neuron in accordance with a number of embodiments of the present disclosure.

FIG. 1 illustrates an example of an artificial neuron (e.g., neuron model) 100 that can be used to mimic a neuron (e.g., of a human brain) in accordance with a number of embodiments of the present disclosure. Such neuron models can sometimes be referred to as perceptrons. A number of inputs x1 to xN, which can be referred to as stimuli, can be respectively applied to inputs 102-1 to 102-N of neuron model 100. Signals, such as voltages, currents, or particular data values (e.g., binary digits), corresponding to inputs x1 to xN can be generated responsive to sensing some form of stimuli and can be applied inputs 102-1 to 102-N.

In various instances, the inputs x1 to xN can be respectively weighted by the weights w1 to wN that can be referred to as synaptic weights. For example, inputs x1 to xN can be respectively multiplied by the weights w1 to wN to respectively weight inputs x1 to xN. For example, each weighted input can be referred to as a synapse, and the weight can correspond to a memory in human brain behavior.

Neuron model 100 can include a summation function 104 that can perform an addition operation on the weighted inputs to produce an output 106, such as SUM=x1w1+x2w2+ . . . +xNwN. In neural network theory, for example, "SUM" can be referred to as "NET" (e.g., from the term "NETwork"). For example, the weighted signals corresponding to weighted inputs x1w1 to xNwN can be summed. In some examples, the summation function can be referred to as a transfer function. Neuron model 100 further includes a function 108, such as a function φ, configured to respond to the summation SUM and to generate an output value Y at an output 110. In some examples, function 108 can be referred to as an activation function. Outputs of neuron models can sometimes be referred to as classes.

Various functions can be utilized for the function 108. For example, function 108 can include a threshold function (e.g., a step function) to determine if SUM is above or below a particular threshold level. Such a threshold function might generate a logic high output (e.g., a logical 1) on the output 110 if SUM is greater than or equal to the particular threshold amount and might generate a logic low (e.g., a logical 0) on the output 110 if SUM is below the particular threshold amount.

In some examples, function 108 can be a sigmoid function, wherein the sigmoid function might be expressed as $S(z)=1/(1+e^{\lambda z})$, in which $\lambda$, is a constant and z can be SUM. For example, function 108 can be a non-linear function. In some examples, the generated output value Y at the output 110 can be applied to a number of additional neuron models, such as to inputs 102 of different neuron models, of a neural network of neuron models.

In some examples, NAND flash memory can be configured to facilitate neural network operations in accordance with a number of embodiments disclosed herein. NAND flash memory can include groups (e.g., strings) of series-coupled (e.g., one-transistor) non-volatile memory cells. Changes in threshold voltages of the cells, through programming of charge storage structures, such as floating gates or charge trapping layers, among others, can determine the data state of each cell.

The series-coupled memory cells in a string can be between a data line (e.g., a bit line) and a source. For example, one end of the string can be coupled in series with a select transistor that can be configured to selectively couple the string to the data line, and an opposite end of the string can be coupled in series with a select transistor that can be configured to selectively couple the string to the source. Memory cells at respective locations in the strings can be commonly coupled to respective access lines, such as word lines. For example, control gates of the memory cells at each respective location in a string can be coupled to or form a portion of a respective access line.

In some examples, a memory array can be a stacked memory array that can be referred to as a three-dimensional memory array, such as a three-dimensional NAND memory array. In a stacked memory array, the strings can be adjacent to semiconductor structures (e.g., vertical semiconductor pillars), and the memory cells in the strings can be at different levels (e.g., vertical levels). The memory cells at a common level, for example, may form a level of memory cells, sometimes referred to as a tier of memory cells. The memory cells at each respective level can be commonly coupled to a respective common assess line.

Memory cells can store a single bit per cell or multiple bits per cell such as, two bits per cell, three bits per cell, four bits per cell, and so on. A memory cell can be programmed to one of $2^n$ data states, with n being the number of bits per cell. Each data state can correspond to a different threshold voltage (Vt) distribution, and the memory cell can be programmed to a Vt that can correspond to one of the Vt distributions. For example, for two bits per cell, a memory cell can be programmed to a Vt corresponding to one of four data states 11, 10, 01, and 00, and for one bit per cell, a memory cell can be programmed to a Vt corresponding to one of two data states 0 and 1.

Figure 2A:
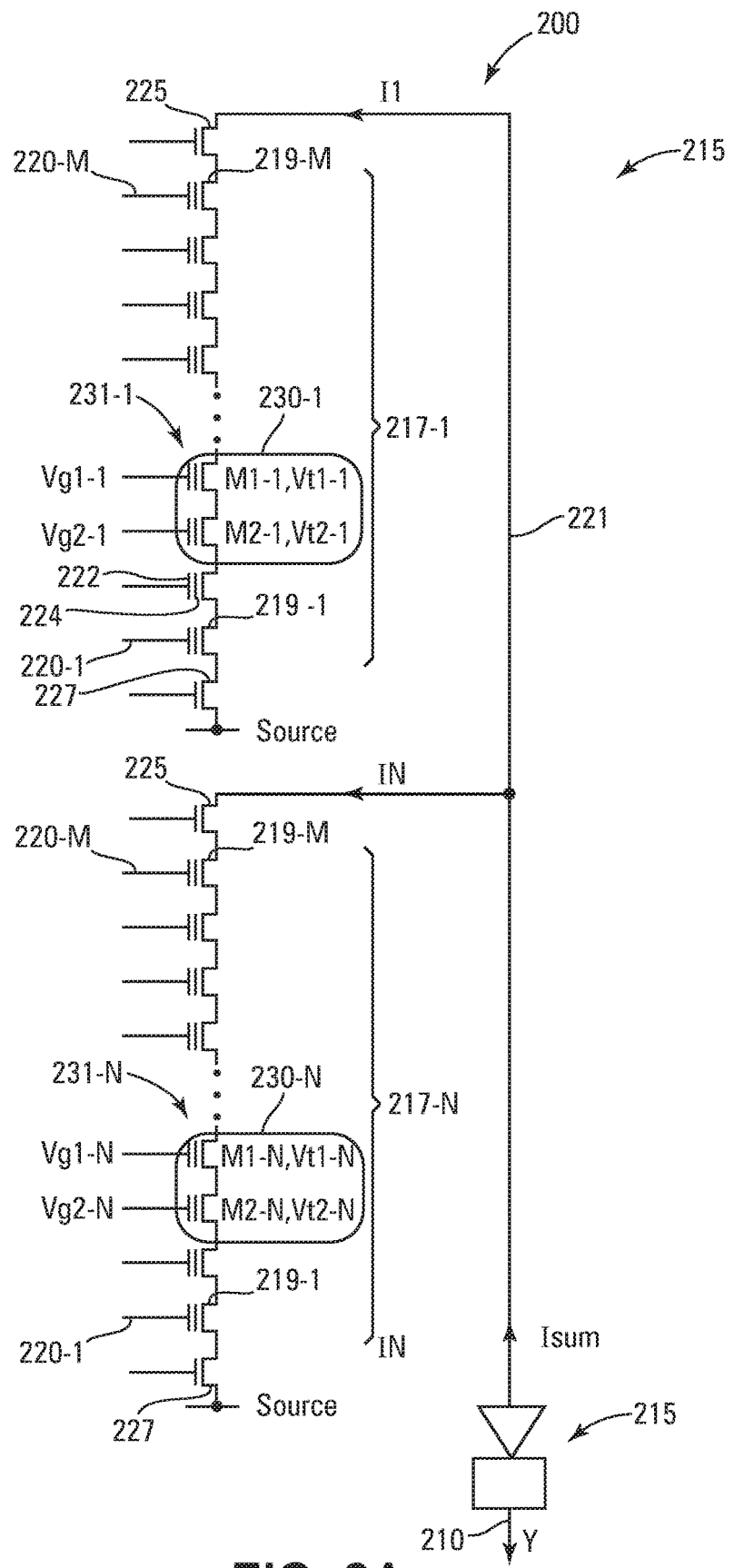
FIG. 2A is schematic diagram of a portion of a memory device configured to facilitate neural network operations in accordance with a number of embodiments of the present disclosure.
Figure 2B:
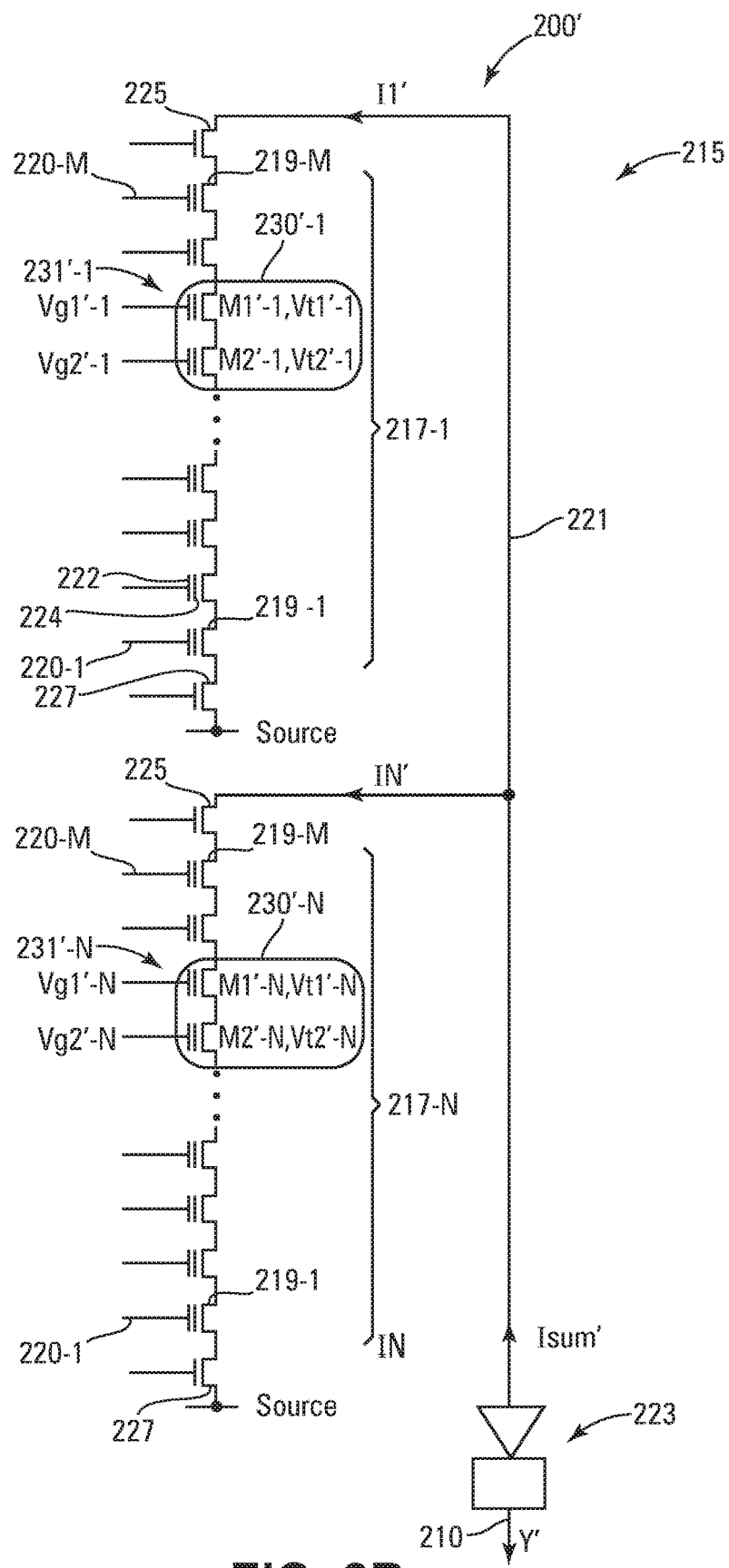
FIG. 2B is schematic diagram of a portion of a memory device configured to facilitate neural network operations in accordance with a number of embodiments of the present disclosure.

FIGS. 2A and 2B are schematic diagrams of a portion of a memory device 215 configured to facilitate neural network operations in accordance with a number of embodiments of the present disclosure. For example, FIGS. 2A and 2B respectively include neuron models 200 and 200', that correspond to neuron model 100, at different layers (e.g., levels) of a neural network. In some examples, FIGS. 2A and 2B correspond to a feed-forward neural network in which the output of the layer corresponding to FIG. 2A can be used as an input to the layer corresponding to FIG. 2B.

Memory 215 has N strings (e.g., NAND strings) 217-1 to 217-N of series-coupled memory cells 219-1 to 219-M. In some examples, strings 217 can be vertical stings in a stacked memory array. Control gates of memory cells 219-1 to 219-M can be respectively coupled to or can respectively form a portion of access lines 220-1 to 220-M. For example, each memory cell 219 can include a control gate 222 and a charge storage structure 224. One end of each of strings 217-1 to 217-N is coupled to the same data line 221. The opposite end of each of strings 217-1 to 217-N is coupled to a source. For some embodiments, the respective strings 217-1 to 217-N can be respective portions of blocks of memory cells 217. A block of memory cells can refer to a group of memory cells that is commonly erased. For example, different sets of access lines 220-1 to 220-M can be coupled the respective blocks.

In FIG. 2A, data line 221 can be configured to sum weighted currents I1 to IN respectively flowing through strings 217-1 to 217-N to produce a summed current Isum, whereas in FIG. 2B, data line 221 can be configured to sum weighted currents I1' to IN' respectively flowing through strings 217-1 to 217-N to produce a summed current Isum'. For example, data line 221 can be configured to implement a summation function, such as summation function 104, of the neuron models 200 and 200'.

Data line 221 is coupled to sensing circuitry 223 that can include sense amplifiers, comparators, and data latches. For example, the sense circuitry 223 can sense the current Isum or Isum' and can latch single or multiple bits (e.g., four bits) of data corresponding to the sensed current Isum or Isum'. Sensing circuitry 223 can be configured to implement a function, such as function 108, in response to Isum to generate the output Y or to generate the output Y' on the output 210 in response to Isum'.

Sensing circuitry 223 can be configured to perform an analog-to-digital conversions. For example, sensing circuitry 223 can include an analog-to-digital converter (ADC) that can convert the sensed current to a data value (e.g., a digital data value) corresponding to the sensed current, such as a digital representation of the sensed current. In some examples, the output Y or Y' can be threshold function of Isum or Isum'. For example, the output Y or Y' can be a logical one (1) in response to Isum or Isum' being greater than or equal to a threshold amount or a logical (0) in response to Isum or Isum' being less than the threshold amount.

A respective select transistor 225 can be configured to selectively couple each of the respective strings 217-1 to 217-N to data line 221 in response to activating the respective select transistor 225. A respective select transistor 227 can be configured to selectively couple each of the respective strings 217-1 to 217-N to the source in response to activating the respective select transistor 227.

The neuron model 200 depicted in FIG. 2A can include pairs 230-1 to 230-N of memory cells (e.g., adjacent memory cells) respectively in strings 217-1 to 217-N, data line 221, and sensing circuitry 223. Currents I1 to IN in FIG. 2A can be weighted currents responsive to respectively activating pairs 230-1 to 230-N while the remaining memory cells in each of strings 217-1 to 217-N are operated in a pass-through mode. For example, pass voltages can be applied to the control gates of those memory cells via the access lines 220 coupled to those control gates to place the memory cells in the pass-through mode. The pass voltages can be sufficiently high so that memory cells operating in the pass-through mode offer relatively little resistance to current flow. As such, the respective currents I1 to IN through the respective strings 217-1 to 217-N can depend on states of the respective pairs 230-1 to 230-N and voltages applied to the respective pairs 230-1 to 230-N.

Each of the respective pairs 230-1 to 230-N can include memory cells M1 and M2. For example, pairs 230-1 to 230-N can respectively include memory cells M1-1 and M2-1 to M1-N and M1-N. Memory cells M1-1 to M1-N can be respectively programmed to threshold voltages Vt1-1 to Vt1-N, and memory cells M2-1 to M2-N can be respectively programmed to threshold voltages Vt2-1 to Vt2-N. In some examples, the respective pairs 230-1 to 230-N can be respectively referred to as synapse models (e.g., synaptic cells) 231-1 to 231-N of neuron model 200.

Memory cells M1-1 to M1-N can be respectively activated concurrently in response to respectively applying sense (e.g., read) voltages Vg1-1 to Vg1-N, that are respectively greater than threshold voltages Vt1-1 to Vt1-N, to the control gates of memory cells M1-1 to M1-N concurrently. Memory cells M2-1 to M2-N can be respectively activated concurrently with memory cells M1-1 to M1-N in response to respectively applying sense voltages Vg2-1 to Vg2-N, that are respectively greater than threshold voltages Vt2-1 to Vt2-N, to the control gates of memory cells M2-1 to M2-N concurrently with applying voltages Vg1-1 to Vg1-N.

In some examples, voltages Vg1-1 to Vg1-N can be received by 215 as initial inputs for the neural network to act upon. Alternatively, voltages Vg1-1 to Vg1-N might have been generated previously by other neuron models of memory 215, for example.

Data line 221 can be charged to a voltage before applying voltages Vg1-1 to Vg1-N and Vg2-1 to Vg2-N. For example, the voltage on data line 221 can be greater than the voltage of the source. As such, while the select transistors 225 and 227 are activated, the respective portions I1 to IN of the current Isum can flow from data line 221 through the respective strings 217-1 to 217-N to the source to discharge data line 221 in response to the activation of the respective pairs 230-1 to 230-N by the respective voltages Vg1-1 to Vg1-N and Vg2-1 to Vg2-N.

In some examples, voltages Vg1 and Vg2 can be referred to as input gate voltages. Voltages Vg1-1 to Vg1-N can respectively correspond to the inputs x1 to xN, and threshold voltages Vt2-1 to Vt2-N can respectively correspond to the weights w1 to wN. In some examples, voltages Vg2-1 to Vg2-N, Vt1-1 to Vt1-N, and Vt2-1 to Vt2-N can have fixed values. Voltages Vg2-1 to Vg2-N and Vt1-1 to Vt1-N can be predetermined from simulations of memory cells M1 and M2, and Vt2-1 to Vt2-N can be predetermined from a model of neural network machine learning.

Figure 2C:
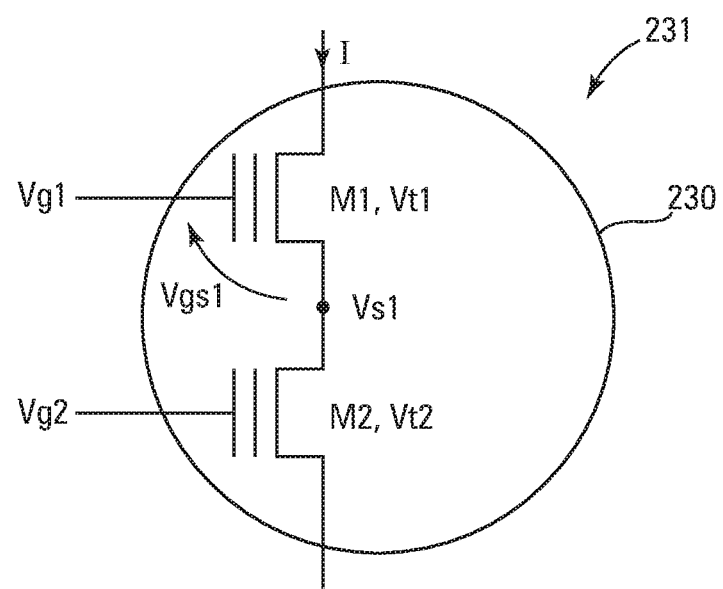
FIG. 2C illustrates a synapse model in accordance with a number of embodiments of the present disclosure.

FIG. 2C illustrates a representative synapse model 231 that can be the various synapse models described herein in accordance with a number of embodiments of the present disclosure. Synapse model 231 includes representative pair 230 of memory cells M1 and M2 that can be the various pairs disclosed herein, such as in FIGS. 2A and 2B. For example, memory cells M1 and M2 are coupled in series and can be respectively programmed to threshold voltages Vt1 and Vt2. For example, memory cells M1 and M2 can form a double transconductor.

Input voltages Vg1 and Vg2 are respectively applied to the control gates of memory cells M1 and M2. Input voltages Vg1 and Vg2 can respectively activate memory cells M1 and M2 such that a current I can flow through memory cells M1 and M2.

The current I can be a function of Vg1 and Vt2. For example, the current I can correspond to the product of Vg1 and Vt2. In some examples, the input voltage Vg1 and threshold voltage Vt2 can be selected such that the current I is a linear function of (e.g., directly proportional to) the product of Vg1 and Vt2. The current I can be g×(Vg1×Vt2), with g being the transconductance gain of memory cells M1 and M2 in combination. As such, the pair 230 can operate as an analog multiplier that can generate the current I.

The transconductance gain g can be modulated by varying Vg1, with VG2, Vt1, and Vt2 fixed. Memory cell M2 can provide a variable resistance (e.g., that can be referred to as a degeneration resistance) that can be regulated by the gate-source voltage Vgs1 of memory cell M1 that can act as a source follower.

Note that the current I is weighted by Vt2. For example, Vg1 can correspond to an input x, and Vt2 can correspond to a weight w. In neuron model 200, currents I1 to IN can respectively be g1×(Vg1-1×Vt2-1) to gN×(Vg1-N× Vt2-N) with g1 to gN respectively being the transconductance gains of pairs 230-1 to 230-N.

In some examples, memory cell M2 can be programmed to store multiple bits. For example, Vt2 can be one of a number of Vt2s to which memory cell M2 can be programmed, thereby allowing a number of different weights.

The neuron model 200' depicted in FIG. 2B can include pairs 230'-1 to 230'-N of memory cells (e.g., adjacent memory cells) respectively in strings 217-1 to 217-N, data line 221, and sensing circuitry 223. Currents I1' to IN' can be weighted currents responsive to respectively activating pairs 230'-1 to 230'-N while the remaining memory cells in each of strings 217-1 to 217-N are operated in a pass-through mode. For example, the respective pairs 230' can be at different locations in the respective strings 217 than the respective pairs 230 in FIG. 2A.

Pairs 230'-1 to 230'-N can respectively include memory cells M1'-1 and M2'-1 to M1'-N and M2'-N. Memory cells M1'-1 to M1'-N can be respectively programmed to threshold voltages Vt1'-1 to Vt1'-N, and memory cells M2'-1 to M2'-N can be respectively programmed to threshold voltages Vt2'-1 to Vt2'-N. Note that synapse models 231'-1 to 231'-N of neuron model 200' can respectively include pairs 230'-1 to 230'-N.

Memory cells M1'-1 to M1'-N can be respectively activated concurrently in response to respectively applying sense voltages Vg1'-1 to Vg1'-N, that can be respectively greater than threshold voltages Vt1'-1 to Vt1'-N, to the control gates of memory cells M1'-1 to M1'-N concurrently. Memory cells M2'-1 to M2'-N can be respectively activated concurrently with activating memory cells M1'-1 to M1'-N in response to respectively applying sense voltages Vg2'-1 to Vg2'-N, that are respectively greater than threshold voltages Vt2'-1 to Vt2'-N, to the control gates of memory cells M2'-1 to M2'-N concurrently with applying voltages Vg1'-1 to Vg1'-N that can be predetermined from a software model of a neural network.

Voltages Vg1'-1 to Vg1'-N can respectively correspond to the inputs x1 to xN, and threshold voltages Vt2'-1 to Vt2'-N can respectively correspond to the weights w1 to wN. In some examples, Vg2'-1 to Vg2'-N, Vt1'-1 to Vt1'-N, and Vt2'-1 to Vt2'-N can have fixed values.

In an example of the feed-forward approach, Vg1'-1 to Vg1'-N can be based on the output Y (e.g., the output of neuron model 200). For example, access line drivers coupled to the control gates of memory cells M1'-1 to M1'-N can generate Vg1'-1 to Vg1'-N based on the output Y. For example, Vg1'-1 to Vg1'-N can be generated as functions, such as threshold functions or a sigmoid functions, of Y. In some examples, a digital representation of a voltage can be generated from digital representations of Isum, and a digital-to-analog converter (DAC) (not shown in FIGS. 2A and 2B) can convert digital representation to an analog voltage, and the analog voltages Vg1'-1 to Vg1'-N can be that analog voltage. Note that currents I'1 to I'N can respectively be g1'×(Vg1'-1×Vt2'-1) to gN'×(Vg1'-N×Vt2'-N) with g1' to gN' respectively being the transconductance gains of pairs 230'-1 to 230'-N.

Figure 3A:
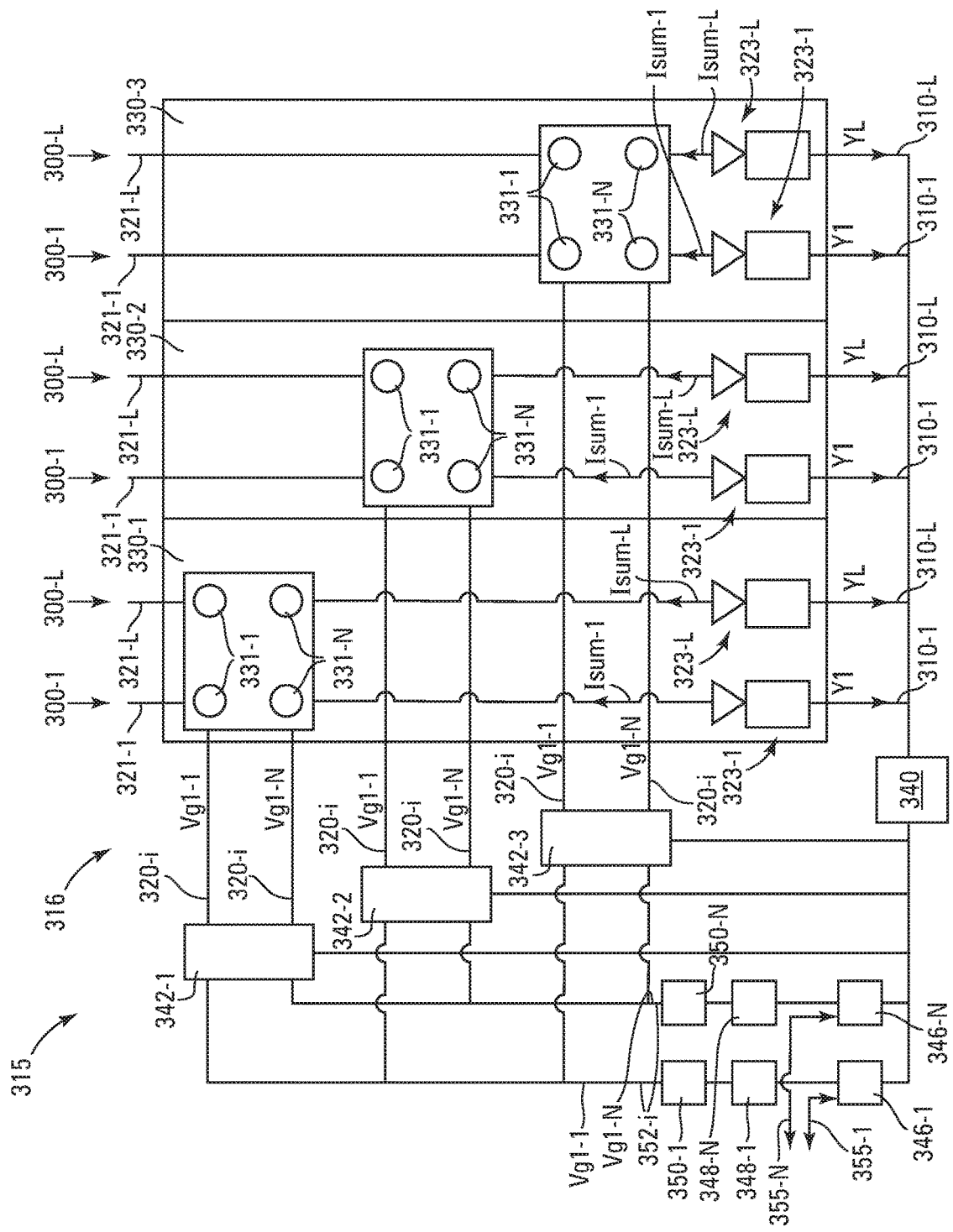
FIG. 3A illustrates a portion of a memory configured as a neural network model to facilitate neural network operations in accordance with a number of embodiments of the present disclosure.

FIG. 3A illustrates a portion of a memory 315 configured as a neural network model 316 to facilitate neural network operations in accordance with a number of embodiments of the present disclosure. Neural network model 316 can include a number of different layers 330, such as layers 330-1 to 330-3, of a neural network. Each of the layers 330-1 to 330-3 includes neuron models 300-1 to 300-L. Each of neuron models 300-1 to 300-L can be neuron model 200 and can correspond to neuron model 100. Neuron models 300-1 to 300-L of each of the layers 330-1 to 330-3 can respectively generate outputs Y1 to YL respectively on outputs 310-1 to 310-L.

Outputs 310-1 to 310-L of the respective layers 330 are coupled to a controller 340. Controller 340 is coupled to switches 342-1 to 342-3 that are respectively coupled to layers 330-1 to 330-3. Controller 340 is also coupled to registers 346-1 to 346-N that are respectively coupled to DACs 348-1 to 348-N that are respectively coupled to global access line drivers 350-1 to 350-N that are each coupled to a respective global access line 352-$i$. Global access line drivers 350-1 to 350-N are configured to output analog voltages Vg1-1 to Vg1-N to the respective global access lines 352-$i$. Although shown separately, registers 346-1 to 346-N, DACs 348-1 to 348-N, and/or access line drivers 350-1 to 350-N can be included in controller 340.

Bi-directional interfaces 355-1 to 355-N can be respectively coupled to registers 346-1 to 346-N. For example, data, such as data from layer 330-3, can be output from memory 315 (e.g., to a host), to other portions of memory 315, or to another neural network over bi-directional interfaces 355-1 to 355-N. Data can be received at registers 346-1 to 346-N over bi-directional interfaces 355-1 to 355-N from the host, another portion of memory 315, or another neural network as input data to layer 330-1, for example. As such, registers 346-1 to 346-N can function as an input and/or output layer of neural network model 316.

The global access lines 352-$i$ are coupled to switches 342-1 to 342-3. Each of the switches 342-1 to 342-3 is configured to selectively couple the respective global access lines 352-$i$ to respective local access lines 320-$i$ in response to receiving signals from controller 340 so that the respective voltages Vg1-1 to Vg1-N are applied to the respective local access lines 320-$i$.

Figure 3B:
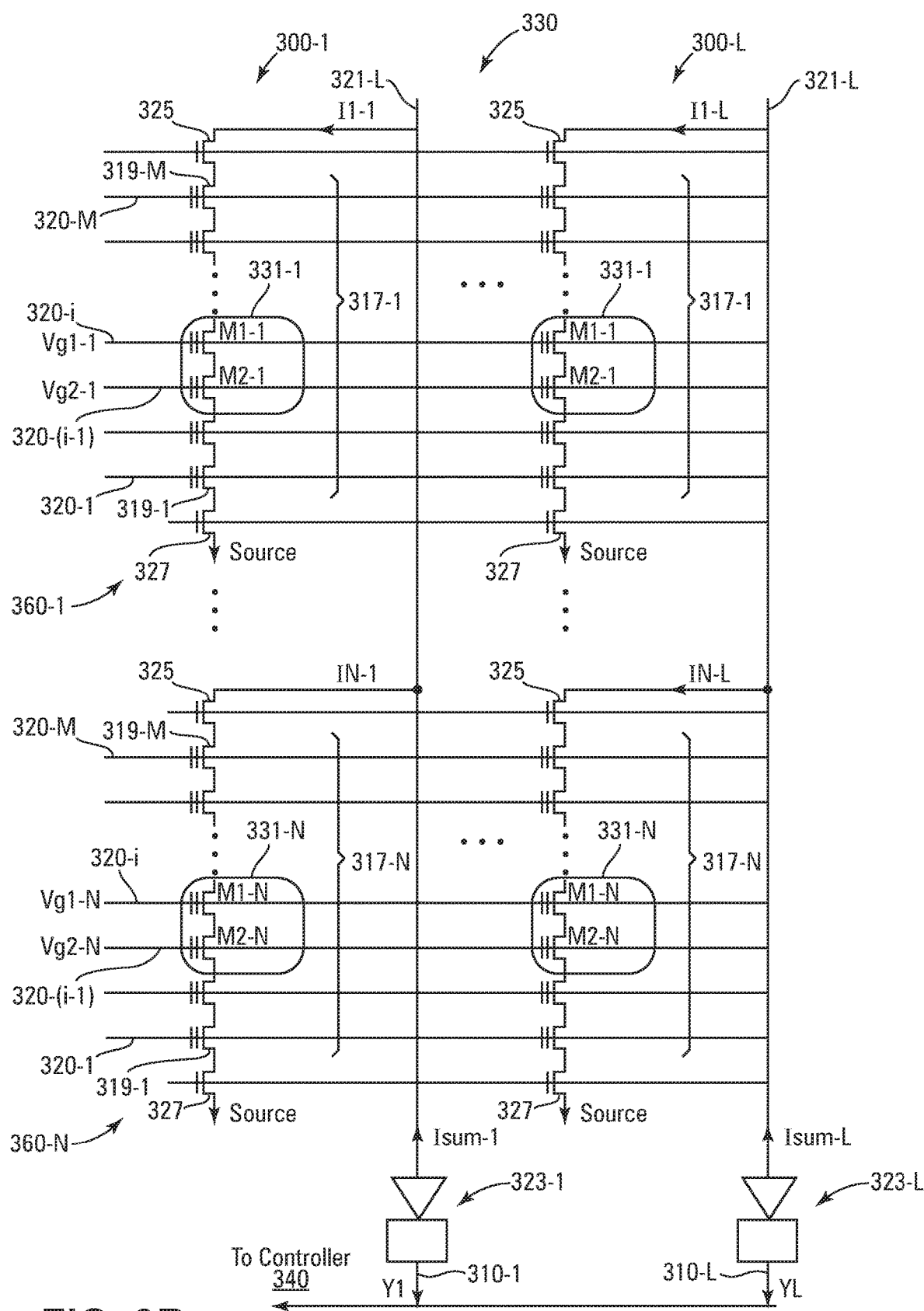
FIG. 3B illustrates a layer of a neural network model in accordance with a number of embodiments of the present disclosure.

FIG. 3B illustrates a representative layer 330 of a neural network model that can be the various layers 330-1 to 330-3 in accordance with a number of embodiments of the present disclosure. For example, each of the respective layers 330-1 to 330-3 can be as depicted and described for layer 330. In some examples, layer 330 can include a number of blocks 360, such as blocks 360-1 to 360-N, that respectively include sets of strings 317-1 to sets of strings 317-N. Each of the strings 317 includes series-coupled memory cells 319-1 to 319-M. Note that the respective blocks 360 can be commonly erased independently of each other.

Layer 330 includes the neuron models 300-1 to 300-L. Each of the respective neuron models 300-1 to 300-L can be neuron model 200. Neuron models 300-1 to 300-L can respectively include data lines 321-1 to 321-L and sensing circuitries 323-1 to 323-L respectively coupled to the data lines 321-1 to 321-L. Each of sensing circuitries 323-1 to 323-L can be sensing circuitry 223. Sensing circuitries 323-1 to 323-L can respectively generate outputs Y1 to YL on outputs 310-1 to 310-L.

Each of the respective neuron models 330-1 to 330-L can include synapse models 331-1 to 331-N (e.g., represented by circles in FIG. 3A) coupled to the respective data lines 321-1 to 321-L. Each of the respective synapse models 331-1 to 331-N can include a pair of adjacent memory cells M1 and M2 coupled in series, as described previously in conjunction with FIGS. 2A to 2C. For example, synapse models 331-1 to 331-N can respectively include memory cell pair M1-1 and M2-2 to memory cell pair M1-N and M2-N. Each of the respective synapse models 331-1 to 331-N can be synapse model 231, for example.

As described previously, memory cells M1-1 to M1-N can be respectively programmed to Vt1-1 to Vt1-N, and memory cells M2-1 to M2-N can be respectively programmed to Vt2-1 to Vt2-N. In some examples, the Vt1$s$ can be different or the same for the respective neuron models 300-1 to 300-N, and the Vt2$s$ can be different or the same for the respective neuron models 300-1 to 300-N. Moreover, the Vt1$s$ can be different or the same for the respective layers 330-1 to 330-3, and the Vt2$s$ can be different or the same for the respective layers 330-1 to 330-3.

The memory cell pair M1-1 and M2-2 to memory cell pair M1-N and M2-N can be respectively included in each of strings 317-1 to each of strings 317-N. The strings 317-1 to 317-N of the respective neuron models 330-1 to 330-L can be coupled to the respective data lines data lines 321-1 to 321-L of the respective neuron models 300-1 to 300-L.

Each respective string 317 can be coupled between respective select transistors 325 and 327. A respective select transistor 325 is configured to selectively couple a respective string 317 to a respective data line 321 in response to the respective select transistor 325 being activated. A respective select transistor 327 is configured to selectively couple a respective string 317 to a source in response to the respective select transistor 327 being activated.

A respective set of local access lines 320-1 to 320-M can be commonly coupled to sets of strings 317 in each of the respective blocks 360. For example, the access lines 320-1 to 320-M of a respective set of access lines can be respectively commonly coupled to the control gates memory cells 319-1 to 319-M of the sets of strings 317 of a respective block 360. A respective access line 320-$i$ is commonly coupled to the memory cells M1 of each of the respective synapse models 331-1 to 331-N. A respective access line 320-($i$–1) is commonly coupled to the memory cells M2 of each of the respective synapse models 331-1 to 331-N.

The voltages Vg1-1 to Vg1-N are respectively applied to the access lines 320-$i$ that are respectively commonly coupled to the memory cells M1-1 to M1-N, and voltages Vg2-1 to Vg2-N are respectively applied to the access lines 320-($i$–1) that are respectively commonly coupled to the memory cells M2-1 to M2-N. As such, voltages Vg1-1 to Vg1-N are respectively commonly applied to memory cells M1-1 to M1-N, and voltages Vg2-1 to Vg2-N are respectively commonly applied to memory cells M2-1 to M2-N.

During operation of layer 330, data lines 321-1 to 321-L can be charged to a voltage. Subsequently, voltages Vg1-1 to Vg1-N are respectively commonly applied to memory cells M1-1 to M1-N concurrently, and voltages Vg2-1 to Vg2-N are respectively commonly applied to memory cells M2-1 to M2-N concurrently with applying voltages Vg1-1 to Vg1-N, while the remaining memory cells in each of the strings 317 are placed in a pass-through mode, while the strings 317 are selectively coupled to the data lines 321 by select transistors 325, and while the strings 317 are selectively coupled to the source by select transistors 327.

Weighted currents I1-1 to IN-1 can respectively flow in the strings 317-1 to 317-N coupled data line 321-1 in response to the memory cell pair M1-1 and M2-2 to memory cell pair M1-N and M2-N in neuron model 330-1 being activated so that the current Isum-1 on data line 321-1 is the sum of the currents I1-1 to IN-1. Weighted currents I1-L to IN-L can respectively flow in the strings 317-1 to 317-N coupled data line 321-L in response to the memory cell pair M1-1 and M2-2 to memory cell pair M1-N and M2-N in neuron model 330-L being activated so that the current Isum-L on data line 321-L is the sum of the currents I1-L to IN-L.

Note that the currents I1-1 to IN-1 and/or the currents I1-L to IN-L can respectively be g1×(Vg1-1×Vt2-1) to gN×(Vg1-N×Vt2-N), with g1 to gN respectively being the transconductance gains of synapse models 331-1 to 331-N, Vg1-1 to Vg1-N respectively being the inputs to synapse models 331-1 to 331-N, and Vt2-1 to Vt2-N respectively being the weights of synapse models 331-1 to 331-N. For example, the currents I1-1 to IN-1 and/or the currents I1-L to IN-L can be respectively weighted by Vt2-1 to Vt2-N.

Sense circuitries 323-1 to 323-L can respectively sense the currents Isum-1 to Isum-L and can respectively generate the outputs Y1 to YL in response to respectively sensing the currents Isum-1 to Isum-L. In some examples, sense circuitries 323-1 to 323-L can include ADCs configured to convert the sensed analog currents Isum-1 to Isum-L to digital representations thereof. The outputs Y1 to YL can then be sent to controller 340. In some examples, the outputs Y1 to YL can be represented by a number of bits, such as one bit in one latch, two bits in two latches, three bits in three latches, four bits in four latches, and so on. For example, the bits can correspond to a respective activation level for another neuron model.

During operation of the neural network model 316 in FIG. 3A, digital representations of analog voltages Vg1-1 to Vg1-N can be respectively received at registers 346-1 to 346-N respectively over bi-directional interfaces 355-1 to 355-N. DACs 348-1 to 348-N can subsequently respectively convert the digital representations of analog voltages Vg1-1 to Vg1-N to the analog voltages Vg1-1 to Vg1-N.

Controller 340 can then activate switch 342-1 so that voltages Vg1-1 to Vg1-N are respectively applied, by global access line drivers 350-1 to 350-N, to the local access lines 320-$i$ respectively coupled to the memory cells M1-1 to M1-N respectively of the synapse models 331-1 to 331-N of layer 330-1. While the voltages Vg1-1 to Vg1-N are being applied, the voltages Vg2-1 to Vg2-N are respectively applied to the local access lines 320-($i$−1) respectively coupled to the memory cells M2-1 to M2-N respectively of the synapse models 331-1 to 331-N of layer 330-1. As a result, the currents Isum-1 to Isum-L are respectively produced on data lines 321-1 to 321-L of layer 330-1, as described in conjunction with FIG. 3B.

Sense amplifiers 323-1 to 323-L of layer 330-1 respectively generate the outputs Y1 to YL on outputs 310-1 to 310-L in response to respectively sensing currents Isum-1 to Isum-L, as described in conjunction with FIG. 3B. For example, the outputs Y1 to YL can respectively be digital representations of the currents Isum-1 to Isum-L. The outputs Y1 to YL can then be sent to controller 340 that selectively activates switch 342-2 in response to outputs Y1 to YL of layer 330-1.

In some examples, controller 340 can generate a digital representation of a voltage corresponding to the outputs Y1 to YL and can send the digital representation of the voltage to registers 346-1 to 346-N. In some examples, controller 340 can generate an output as a function of the outputs Y1 to YL, such as a threshold function or a sigmoid function. Controller 340 can then generate a digital representation of a voltage based on that output and can send the digital representation of the voltage to registers 346-1 to 346-N.

For example, controller 340 can generate a digital representation of a voltage corresponding to a logical high generated by the threshold function and a digital representation of another voltage corresponding to a logical low generated by the threshold function. In some examples, controller 340 can generate various digital representations of various voltages generated by the sigmoid function.

DACs 348-1 to 348-N can subsequently respectively convert the digital representation of the voltage in registers 346-1 to 346-N to the analog voltages Vg1-1 to Vg1-N. The voltages Vg1-1 to Vg1-N are respectively applied, by global access line drivers 350-1 to 350-N, to the local access lines 320-$i$, via activated switch 342-2, respectively coupled to the memory cells M1-1 to M1-N respectively of the synapse models 331-1 to 331-N of layer 330-2. While the voltages Vg1-1 to Vg1-N are being applied, the voltages Vg2-1 to Vg2-N are respectively applied to the local access lines 320-($i$−1) respectively coupled to the memory cells M2-1 to M2-N respectively of the synapse models 331-1 to 331-N of layer 330-2. As a result, the currents Isum-1 to Isum-L are respectively produced on data lines 321-1 to 321-L of layer 330-2, as described in conjunction with FIG. 3B.

Sense amplifiers 323-1 to 323-L of layer 330-2 respectively generate the outputs Y1 to YL on outputs 310-1 to 310-L in response to respectively sensing currents Isum-1 to Isum-L, as described in conjunction with FIG. 3B. The outputs Y1 to YL of layer 330-2 can then be sent to controller 340 that selectively activates switch 342-3 in response to the outputs Y1 to YL.

Controller 340 can generate a digital representation of a voltage corresponding to the outputs Y1 to YL of layer 330-2 and can send the digital representation of the voltage to registers 346-1 to 346-N, as described in conjunction with layer 330-1. For example, controller 340 can generate a digital representation of a voltage based on a function of the outputs Y1 to YL of layer 330-2, such as a threshold function or a sigmoid function of the outputs Y1 to YL of layer 330-2.

DACs 348-1 to 348-N can subsequently respectively convert the digital representation of the voltage in registers 346-1 to 346-N to the analog voltages Vg1-1 to Vg1-N. The voltages Vg1-1 to Vg1-N are respectively applied by global access line drivers 350-1 to 350-N to the local access lines 320-$i$, via activated switch 342-3, respectively coupled to the memory cells M1-1 to M1-N respectively of the synapse models 331-1 to 331-N of layer 330-3. While the voltages Vg1-1 to Vg1-N are being applied, the voltages Vg2-1 to Vg2-N are respectively applied to the local access lines 320-($i$−1) respectively coupled to the memory cells M2-1 to M2-N respectively of the synapses 331-1 to 331-N of layer 330-3. As a result, the currents Isum-1 to Isum-L are respectively produced on data lines 321-1 to 321-L of layer 330-3, as described in conjunction with FIG. 3B.

Sense amplifiers 323-1 to 323-L of layer 330-3 respectively generate the outputs Y1 to YL on outputs 310-1 to 310-L in response to respectively sensing currents Isum-1 to Isum-L, as described in conjunction with FIG. 3B. The outputs Y1 to YL of layer 330-3 can then be sent to controller 340. Controller 340 can generate a digital representation of a voltage corresponding to the outputs Y1 to YL of layer 330-3 and can send the digital representation of a voltage to registers 346-1 to 346-N, as described in conjunction with layer 330-1. For example, controller 340 can then generate a digital representation of a voltage based on a function of the outputs Y1 to YL of layer 330-2, such as a threshold function or a sigmoid function of the outputs Y1 to YL of layer 330-2. The digital representation of the voltage in registers 346-1 to 346-N can then be output over bi-directional interfaces 355-1 to 355-N.

Figure 4:
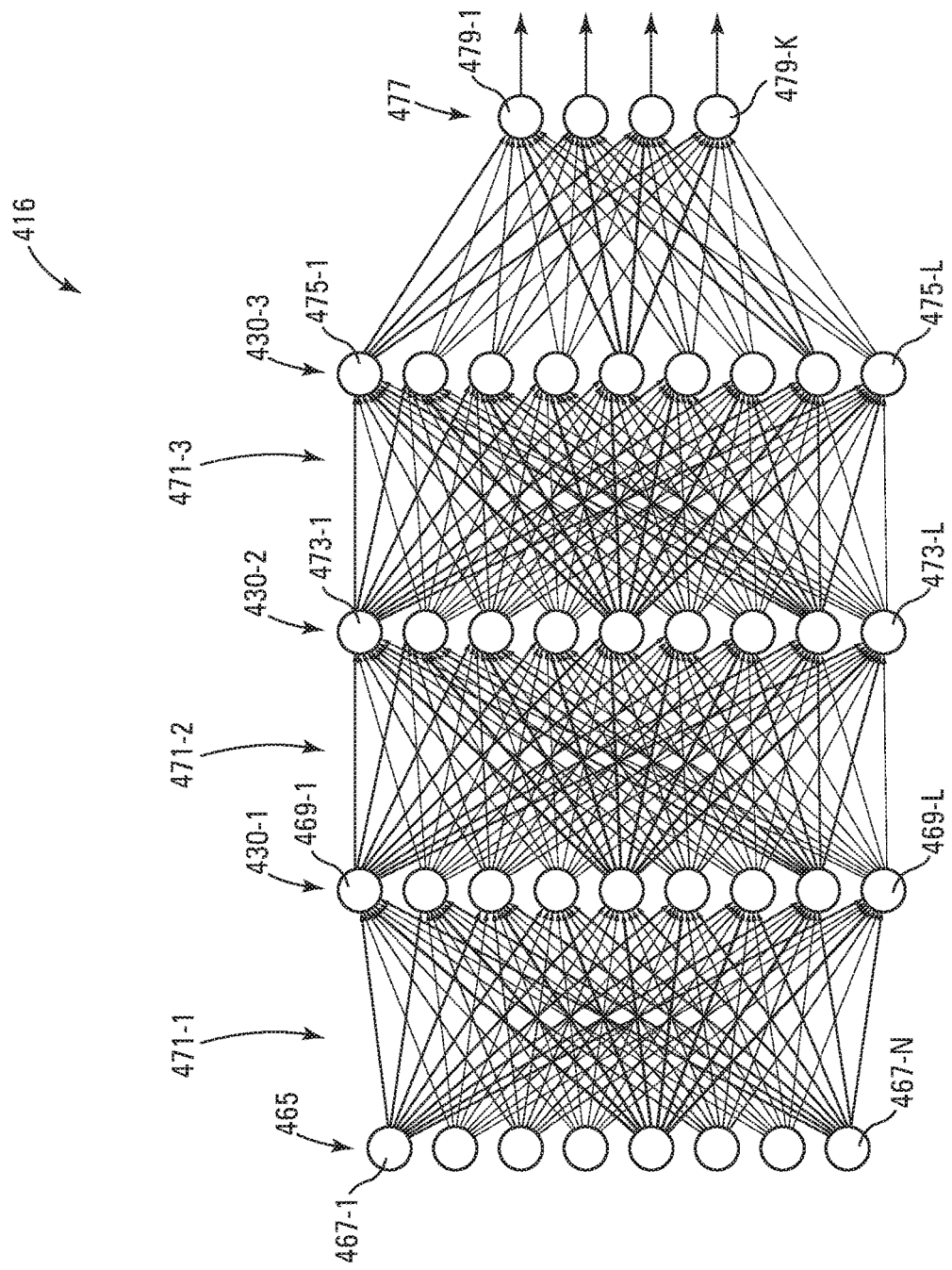
FIG. 4 illustrates an example model of an artificial neural network in accordance with a number of embodiments of the present invention.

FIG. 4 illustrates an example model of an artificial neural network 416 corresponding to the neural network model 316 in accordance with a number of embodiments of the present invention. For example, neural network 416 can be referred to as an artificial neural network. Neural network 416 can include an input layer 465 having nodes 467-1 to 467-N that can correspond to the various inputs disclosed herein, such as the inputs x1 to xN and/or the input voltages Vg1-1 to Vg1-N.

Neural network 416 can include layers 430-1 to 430-3 that can respectively correspond to layers 330-1 to 330-3. Layer 430-1 can include neuron models 469-1 to 469-L. Each of the respective neuron models 469-1 to 469-L can correspond to the various neuron models disclosed herein. For example, neuron models 469-1 to 469-L can respectively correspond to the neuron models 330-1 to 300-L of layer 330-1. Note that each of the respective neuron models 469-1 to 469-L can be coupled to receive inputs from nodes 467-1 to 467-N. The interconnections, in the interconnection region 471-1, between nodes 467-1 to 467-N and each of the respective neuron models 469-1 to 469-L in layer 430-1 can correspond to the various weighted synapse models disclosed herein, such as the synapse models 331-1 to 331-N of each of the respective neuron models 300-1 to 300-L of layer 330-1.

Layer 430-2 can include neuron models 473-1 to 473-L. Each of the respective neuron models 473-1 to 473-L can correspond to the various neuron models disclosed herein. For example, neuron models 473-1 to 473-L can respectively correspond to the neuron models 330-1 to 300-L of layer 330-2. Note that each of the respective neuron models 473-1 to 473-L can be coupled to receive inputs from neuron models 469-1 to 469-L. The interconnections, in the interconnection region 471-2, between neuron models 469-1 to 469-L and each of the respective neuron models 473-1 to 473-L can correspond to the various weighted synapse models disclosed herein, such as the synapse models 331-1 to 331-N of each of the respective neuron models 300-1 to 300-L of layer 330-2.

Layer 430-3 can include neuron models 475-1 to 475-L. Each of the respective neuron models 475-1 to 475-L can correspond to the various neuron models disclosed herein. For example, neuron models 475-1 to 475-L can respectively correspond to the neuron models 330-1 to 300-L of layer 330-3. Note that each of the respective neuron models 475-1 to 475-L can be coupled to receive inputs from neuron models 473-1 to 473-L. The interconnections, in the interconnection region 471-3, between neuron models 473-1 to 473-L and each of the respective neuron models 475-1 to 475-L can correspond to the various weighted synapse models disclosed herein, such as the synapse models 331-1 to 331-N of each of the respective neuron models 300-1 to 300-L of layer 330-3.

Neural network 416 can include an output layer 477 having output nodes 479-1 to 479-K. Each of the respective output nodes 479-1 to 479-K can be coupled to receive inputs from neuron models 475-1 to 475-L.

Figure 5:
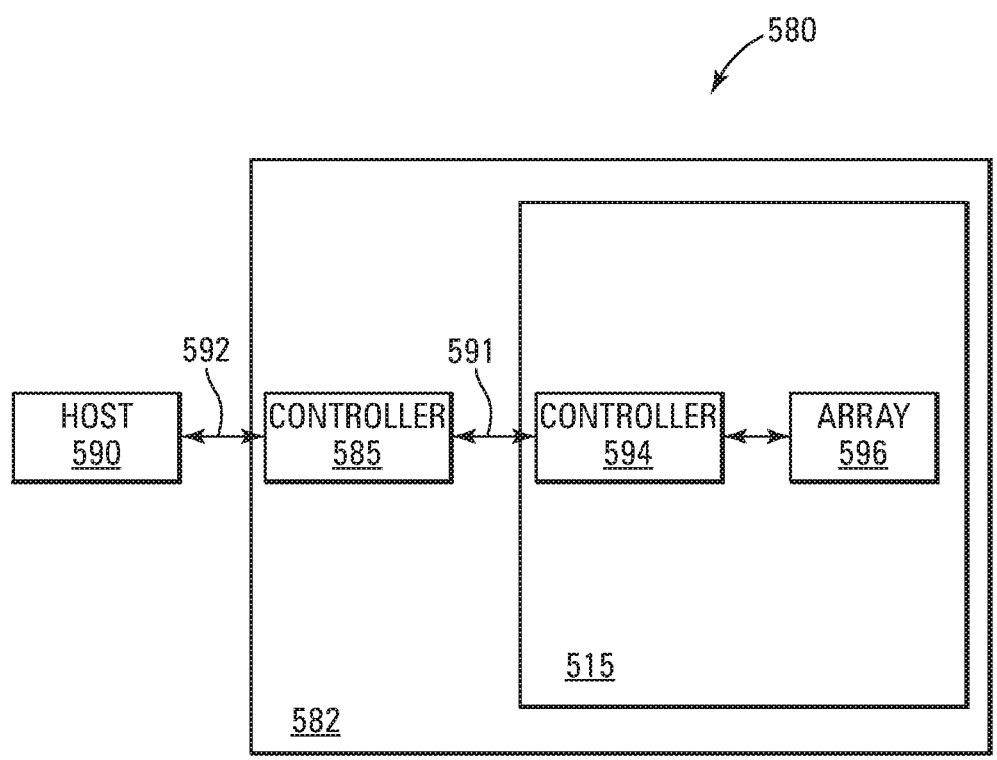
FIG. 5 is a block diagram of an apparatus configured to facilitate neural network operations in accordance with a number of embodiments of the present disclosure.

FIG. 5 is a block diagram of an apparatus in the form of a computing system 580 in accordance with a number of embodiments of the present disclosure. Computing system 580 includes a memory system 582 that can be, for example, a storage system such as an SSD, a UFS device, an eMMC device, etc. However, embodiments are not limited to a particular type of memory system. For example, memory system 582 could serve as main memory for system 580.

As shown in FIG. 5, memory system 582 can include a controller 585 that may be referred to as a memory system controller, in that controller 585 can control a memory 515 that can be various memories disclosed herein. For example, memory 515 can be configured as a neural network model to facilitate neural network operations in accordance with a number of embodiments of the present disclosure. Controller 585 is coupled to a host 590 and to memory 515. For example, memory 515 can include a number of memory devices (e.g., dies, chips, etc.) and can serve as a memory (e.g., main memory) and/or as a storage volume for computing system 580.

Memory 515 can be coupled to controller 585 via an interface 591 (e.g., memory interface) that can include a data bus and that can support various standards and/or comply with various interface types, such as double data rate (DDR), etc. Controller 585 can receive commands, such as read and write commands from host 590. Controller 585 can, for example, receive host data to be written to memory 515 from host 590 via a host interface 592. As used herein, a memory system 582, a controller 585, a memory 515, or a controller 594 might also be separately considered an "apparatus."

Host 590 can be, for example, a host system, such as a personal laptop computer, a desktop computer, a digital camera, a mobile device (e.g., cellular phone), network server, Internet of Things (IoT) enabled device, or a memory card reader, among various other types of hosts. For instance, host 590 can include one or more processors capable of accessing memory 515 (e.g., via controller 585) over interface 592 that can include a bus. Interface 592 may be a standardized interface, such as a serial advanced technology attachment (SATA), peripheral component interconnect express (PCIe), or a universal serial bus (USB), among various others.

Memory 515 can include a number of memory arrays 596 (e.g., referred to collectively as array 596) and a controller 594 that may be referred to as an embedded controller. For example, controller 594 can include controller 340 and can be configured to perform the various neural network operations disclosed herein. Controller 594 can be located internal to the memory 515, and can receive commands (e.g., write commands, read commands, etc.) from the controller 585 via the memory interface 591. Controller 594 can include a state machine and/or a sequencer. Controller 594 can be configured to control the operation of memory 515.

In the preceding detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    applying a first voltage to a first memory cell to activate the first memory cell;
    applying a second voltage to a second memory cell coupled in series with the first memory cell to activate the second memory cell so that current flows through the first and second memory cells; and
    generating an output responsive to the current;
    wherein the first voltage applied to the first memory cell and a threshold voltage of the second memory cell are such that the current is proportional to a product of the first voltage applied to the first memory cell and the threshold voltage of the second memory cell.

2. The method of claim 1, wherein the threshold voltage of the second memory cell is a weight that weights the current.

3. The method of claim 1, further comprising:
    generating a third voltage as a function of the output;
    applying the third voltage to a third memory cell to activate the third memory cell; and
    applying a fourth voltage to a fourth memory cell coupled in series with the third memory cell to activate the fourth memory cell so that current flows through the third and fourth memory cells;
    wherein the third voltage generated as the function of the output and a threshold voltage of the fourth memory cell are such that the current that flows through the third and fourth memory cells is proportional to a product of the third voltage generated as the function of the output and the threshold voltage of the fourth memory cell.

4. The method of claim 3, wherein the function comprises a sigmoid function.

5. The method of claim 3, wherein the function comprises a threshold function.

6. The method of claim 3, wherein the first and second memory cells and the third and fourth memory cells are in a same string of series-coupled memory cells coupled to a data line.

7. The method of claim 3, wherein
    the first and second memory cells are in a first layer of a neural network model; and
    the third and fourth memory cells are in a second layer of the neural network model.

8. The method of claim 1, wherein the output comprises a data value corresponding to the current.

9. The method of claim 1, wherein generating the output responsive to the current comprises:
    sensing the current; and
    converting the sensed current into a digital data output.

10. The method of claim 1, wherein the current is equal to a transconductance gain of the first and second memory cells in combination multiplied by the product of the first voltage applied to the first memory cell and the threshold voltage of the second memory cell.

11. A method, comprising:
    concurrently activating a plurality of pairs of series-coupled memory cells to cause a respective weighted current to flow through each respective pair of the plurality of concurrently activated pairs of series-coupled memory cells, each respective weighted current corresponding to a product of a voltage applied to a first memory cell of the respective pair and a threshold voltage of a second memory cell of the respective pair;
    summing the respective weighted currents on a data line coupled to the plurality of concurrently activated pairs of series-coupled memory cells to produce a summed current; and
    generating an output based on the summed current.

12. The method of claim 11, wherein generating the output based on the summed current comprises generating, by sensing circuitry coupled to the data line, a digital representation of the summed current.

13. An apparatus, comprising:
    a controller;
    a plurality of groups of series-coupled memory cells coupled to a data line;
    wherein
        each respective group comprises a respective first memory cell coupled in series with a respective second memory cell;
        each respective second memory cell is programmed to a respective threshold voltage;

the controller is configured to:
concurrently apply respective first voltages to the respective first memory cells to activate the respective first memory cells concurrently; and
concurrently apply respective second voltages to the respective second memory cells, concurrently with applying the respective first voltages, to activate the respective second memory cells concurrently so that respective portions of current on the data line flow through the respective groups concurrently such that the current on the data line is a sum of the respective portions of current; and
the respective portion of current flowing through each respective group of memory cells is proportional to a product of the first voltage applied to the respective first memory cell of the respective group and the threshold voltage of the second memory cell of the respective group.

14. The apparatus of claim 13, wherein:
the respective first memory cell and the respective second memory cell are configured to simulate a synaptic cell of a neural network;
a gate of the respective first memory cell is configured to receive a signal corresponding to an input of the synaptic cell;
a threshold voltage of the respective second memory cell corresponds to a synaptic weight of the synaptic cell; and
the synaptic cell is operable by, while the signal is applied to the gate of the respective first memory cell, applying a signal to a gate of the respective second memory cell such that a resulting current on a data line to which the respective first and second memory cells are coupled corresponds to an output of the synaptic cell.

15. The apparatus of claim 13, further comprising sensing circuitry coupled to the data line and configured to:
sense the current on the data line; and
convert sensed current to a digital representation of the sensed current.

16. The apparatus of claim 15, wherein the controller is configured to generate a digital representation of an analog voltage from the digital representation of the sensed current.

17. The apparatus of claim 16, wherein the controller is configured to output the digital representation of the analog voltage from the apparatus.

18. The apparatus of claim 16, further comprising an analog to digital converter configured to convert the digital representation of the analog voltage to the analog voltage.

19. The apparatus of claim 18, wherein
the apparatus further comprises an additional data line coupled to an additional group of memory cells that comprises a third memory cell coupled in series with fourth memory cell; and
the controller is configured to:
apply the analog voltage to the third memory cell to activate the third memory cell;
apply a third voltage to the fourth memory cell to activate the fourth memory cell so that current on the additional data line flows through the third and fourth memory cells;
wherein the current that flows through the third and fourth memory cells is proportional to a product of the analog voltage and a threshold voltage of the fourth memory cell.

20. The apparatus of claim 13, wherein the plurality of groups of memory cells are part of a neural network.

21. An apparatus, comprising:
a plurality of pairs of series-coupled memory cells coupled to a data line; and
sensing circuitry coupled to the data line; and
wherein:
the data line is configured to sum respective weighted currents concurrently flowing through respective activated pairs of the plurality of pairs to produce a summed current;
each respective weighted current corresponds to a product of a voltage applied to one of the memory cells of the respective activated pair and a threshold voltage of the other memory cell of the respective activated pair; and
the sense circuitry is configured to sense the summed current and generate an output responsive to the summed current.

22. The apparatus of claim 21, wherein the controller is configured to generate an output as a function of the output generated by the sense circuitry.

23. The apparatus of claim 21, wherein the sense circuitry configured to
generate a first logical output in response to the summed current being greater than or equal to a threshold amount; and
generate a second logical output in response to the summed current being less than the threshold amount.

24. The apparatus of claim 21, wherein each of the plurality of pairs represents a synaptic cell of a neural network implemented in a memory comprising the memory cells.

25. The apparatus of claim 21, wherein each of the plurality of pairs is an analog multiplier.

* * * * *